United States Patent [19]
Tanaka et al.

[11] Patent Number: 5,327,443
[45] Date of Patent: Jul. 5, 1994

[54] PACKAGE-TYPE SEMICONDUCTOR LASER DEVICE

[75] Inventors: Haruo Tanaka; Naofumi Aoki, both of Kyoto, Japan

[73] Assignee: Rohm Co., Ltd., Kyoto, Japan

[21] Appl. No.: 967,279

[22] Filed: Oct. 27, 1992

[30] Foreign Application Priority Data

Oct. 30, 1991 [JP] Japan .................... 3-285206
Nov. 20, 1991 [JP] Japan .................... 3-304820

[51] Int. Cl.5 .................... H01S 3/04; H01S 3/045
[52] U.S. Cl. .................... 372/36; 385/92
[58] Field of Search .................... 372/36; 385/92, 93, 385/94, 88; 257/707

[56] References Cited

U.S. PATENT DOCUMENTS

| | | | |
|---|---|---|---|
| 3,864,019 | 2/1975 | Smolinsky et al. | 385/49 |
| 3,896,305 | 7/1975 | Ostrowsky et al. | 385/49 |
| 3,967,877 | 7/1976 | Heidrich et al. | 385/49 |
| 4,130,343 | 12/1978 | Miller et al. | 385/49 |
| 4,403,243 | 9/1983 | Hakamada | 385/94 |
| 4,756,590 | 7/1988 | Forrest et al. | 385/94 |
| 4,818,053 | 4/1989 | Gordon et al. | 385/92 |
| 4,854,659 | 8/1989 | Hamerslag et al. | 385/49 |
| 5,065,226 | 11/1991 | Kluitmans et al. | 385/92 |
| 5,089,861 | 2/1992 | Tanaka et al. | |
| 5,140,384 | 8/1992 | Tanaka | |
| 5,163,113 | 11/1992 | Melman | 385/49 |
| 5,175,783 | 12/1992 | Tatoh | 385/92 |

Primary Examiner—Rodney B. Bovernick
Assistant Examiner—Robert E. Wise
Attorney, Agent, or Firm—William H. Eilberg

[57] ABSTRACT

A package-type semiconductor laser device comprises a metallic heat sink plate, a semiconductor laser chip carried by the heat sink plate, and a cap mounted on the heat sink plate to enclose the laser chip. The cap has a transparent window in opposed relation to the heat sink plate. The laser chip has a front facet oriented so that the laser chip emits an output laser beam generally in parallel to the heat sink plate. The laser device further comprises a reflective member arranged in the cap for deflecting the output laser beam toward the window of the cap.

16 Claims, 8 Drawing Sheets

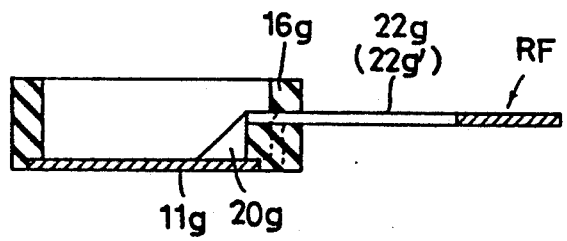
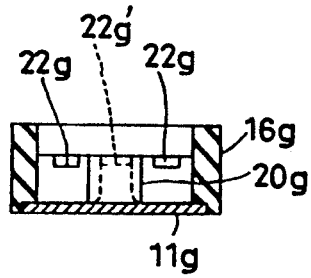
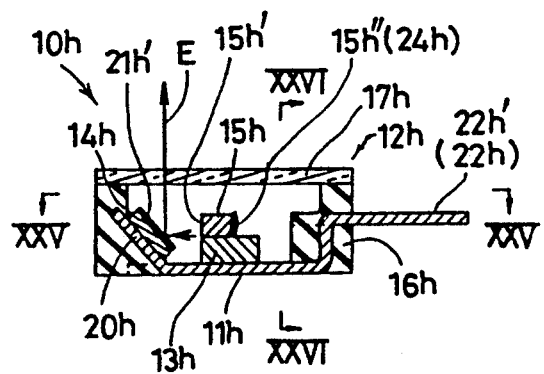
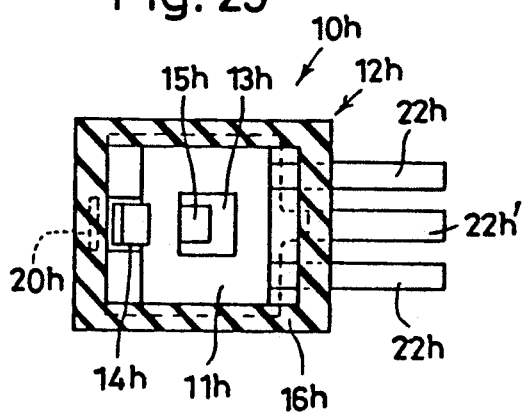
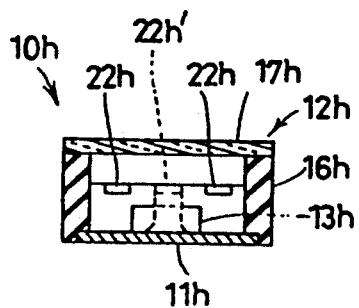

PACKAGE-TYPE SEMICONDUCTOR LASER DEVICE

BACKGROUND OF THE INVENTION

1. Field of the Invention

This invention relates generally to laser devices. More particularly, the present invention relates to a laser device of the type which utilizes a semiconductor laser chip enclosed in a package.

2. Description of the Prior Art

A typical semiconductor laser chip used in a laser device has such a structure as shown in FIG. 29 of the accompanying drawings.

Specifically, as shown in FIG. 29, the laser chip designated by reference numeral 3 has a multilayer crystal sandwiched between a pair of electrodes $3d$, $3e$. The multilayer crystal includes a surface layer formed with a stripe $3b$, and an intermediate activation layer $3a$ formed with a light generating region $3c$ in corresponding relation to the stripe $3b$. When a voltage is applied across the pair of electrodes $3d$, $3e$, excitation occurs in the light generating region $3c$ and emits an output laser beam A from its front facet $3f$ along a longitudinal axis of the laser chip while emitting a monitor laser beam A' from its rear facet $3g$.

Such a semiconductor laser chip is known to generate a considerable heat at the time of laser beam emission. Further, the laser chip is also known to be adversely affected by humidity or other external factors. Thus, it is necessary to take some measure for effectively dissipating heat and for protecting the laser chip against adverse external factors.

One way to overcome the above-described problems is to enclose the semiconductor laser chip in a package which also has a function of dissipating heat, as disclosed in U.S. Pat. No. 5,089,861 or U.S. Pat. No. 5,140,384 for example. A more specific structure of the package-type semiconductor laser device is now described with reference to FIGS. 30–32 of the accompanying drawings.

As shown in FIGS. 30–32, the package-type semiconductor laser device comprises a metallic heat sink plate 1 (which is usually referred to as "stem") having a diameter D and a thickness T. The stem 1 is integrally formed with an upright mounting block 2, and a semiconductor laser chip 3 is mounted on the mounting block 2 via a sub-mount 4. The laser chip 3 together with the sub-mount 4 and the mounting block 2 is enclosed in a cap 5 having a window opening closed by a glass plate 6.

The stem 1 is formed with a pair of perforations $1a$ for receiving a corresponding pair of leads 7 fixed in place by glass sealant 8. Another lead 7 is attached to the underside of the stem 1. Further, the stem 1 is also formed with an inclined recess $1b$ under the laser chip 3 for mounting a monitoring photodiode 9, and associated components are electrically connected by wires W.

With the arrangement described above, the stem or heat sink plate 1 effectively dissipates heat at the time of laser beam emission, whereas the cap 5 prevents entry of adverse external substances. However, the prior art laser device still has the following problems.

First, since the glass window 6 is located vertically above the stem 1, the laser chip 3 must be oriented vertically to emit an output laser beam A toward the window 6. Such an orientation of the laser chip 3 necessitates the provision of the upright mounting block 2. As a result, the overall height H of the laser device must be at least larger than the sum of the stem thickness T and the block height. Thus, it is difficult to reduce the size of the laser device.

Secondly, since the stem 1 must be made of a metal such as carbon steel (because of its function for heat dissipation), it is rather time-taking to integrally form the upright mounting block 2 by forging. Thus, the production cost of the laser device increases due to the presence of the upright mounting block 2.

In the third place, the process step for sealing the perforations $1a$ of the stem 1 is rather troublesome because such sealing must be performed with the leads 7 held inserted in the perforations $1a$. Thus, this process step results in an additional cost increase.

SUMMARY OF THE INVENTION

It is, therefore, an object of the present invention to provide a package-type semiconductor laser device which can realize a great reduction in size and cost.

Another object of the present invention is to provide a package-type semiconductor laser device wherein leads can be readily incorporated without increasing the production cost.

According to the present invention, there is provided a package-type semiconductor laser device comprising: a metallic heat sink plate having a substantially flat support surface; a semiconductor laser chip carried by the support surface of the heat sink plate, the laser chip having a front facet oriented so that the laser chip emits an output laser beam generally in parallel to the support surface of the heat sink plate; a cap mounted on the support surface of the heat sink plate to enclose the laser chip, the cap having a transparent window in opposed relation to the support surface of the heat sink plate; and a reflective member arranged in the cap for deflecting the output laser beam toward the window of the cap.

With the arrangement described above, the output laser beam is emitted from the laser chip generally in parallel to the heat sink plate but deflected by the reflective member toward the window. Thus, the laser chip itself can be arranged in a lying posture, and no upright mounting block need be provided on the heat sink plate. As a result, the size (particularly height) can be greatly reduced in comparison with the prior art package-type semiconductor laser device.

Further, the absence of an upright mounting block eliminates a troublesome process step of forming such a component. Thus, the production cost of the laser device can be greatly reduced.

The cap may comprise a resinous frame and a transparent plate attached to the frame. In this case, leads for the laser chip or other related components may made to penetrate through the resinous frame at the time of molding the latter, and no separate sealing step is needed at the positions of the leads.

Other objects, features and advantages of the present invention will be fully understood from the following detailed description given with reference to the accompanying drawings.

BRIEF DESCRIPTION OF THE DRAWINGS

In the accompanying drawings:

FIG. 22 is a sectional view taken along lines XXII—XXII in FIG. 21;

FIG. 23 is a sectional view taken along lines XXIII—XXIII in FIG. 21;

FIG. 24 is a sectional side view showing a semiconductor laser device according to a ninth embodiment of the present invention;

FIG. 25 is a sectional view taken along lines XXV—XXV in FIG. 24;

FIG. 26 is a sectional view taken along lines XXVI—XXVI in FIG. 24;

DETAILED DESCRIPTION OF THE PREFERRED EMBODIMENTS

Figure 1:
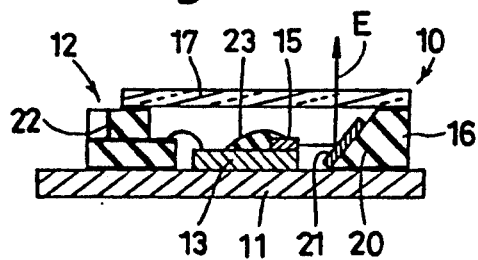
FIG. 1 is a sectional side view showing a semiconductor laser device according to a first embodiment of the present invention.
Figure 2:
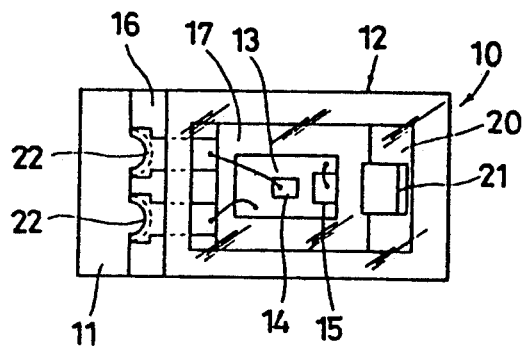
FIG. 2 is a plan view of the same laser device.
Figure 3:
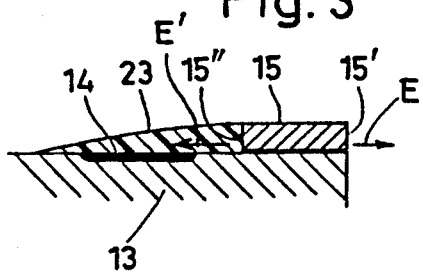
FIG. 3 is an enlarged fragmentary sectional side view showing a portion of the same laser device.
Figure 4:
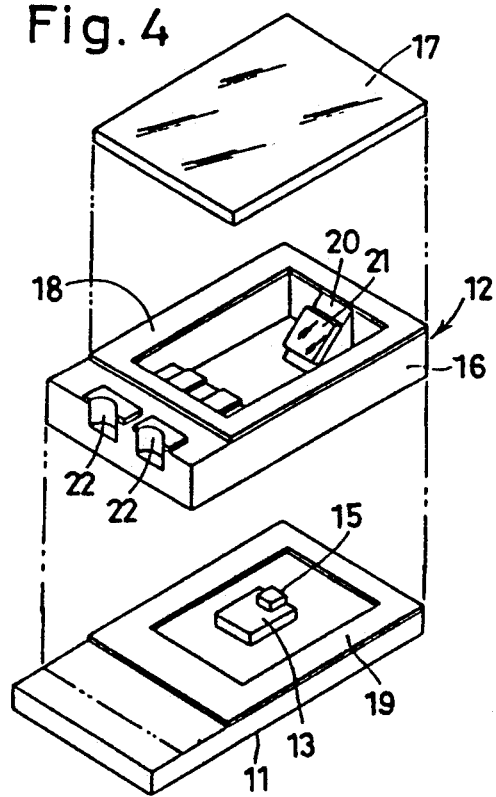
FIG. 4 is an exploded perspective view showing the same laser device.

FIGS. 1 through 28 of the accompanying drawings show various embodiments of the present invention. Throughout these embodiments, like parts are designated by like reference numerals with or without alphabetical suffix such as 11, 11a, 11b for the convenience of illustration.

EMBODIMENT 1

Referring first to FIGS. 1-4 of the accompanying drawings, there is illustrated a package-type semiconductor laser device according to a first embodiment of the present invention. The laser device, which is generally represented by reference numeral 10, comprises a thin heat sink plate 11 and a cap 12 mounted on the heat sink plate 11. The heat sink plate 11 and the cap 12 together form a package.

The heat sink plate 11, which is made of a metal such as carbon steel, copper or aluminum, may be plated with gold or other metal which is excellent in heat conduction. A flat mount 13, which itself has a monitoring photodiode region 14 (FIG. 3), is attached on the heat sink plate 11, and a semiconductor laser chip 15 is attached on the mount 13. The orientation of the laser chip 15 is such that it emits an output laser beam E from its front facet 15' in parallel to the heat sink plate 11 while also emitting a monitor laser beam E' from its rear facet 15".

The cap 12 includes a frame 16 and a glass plate 17. The frame 16 is made of a heat-resistant insulating material such as ceramic and attached fixedly to the heat sink plate 11 by a layer 19 (FIG. 4) of adhesive or low-melting point solder to surround the mount 13. The frame 16 has a window opening closed by the glass plate 17. The glass plate 17 may be attached to the frame 16 by a layer (FIG. 4) of adhesive or special solder (designed for attachment to glass).

The frame 16 is internally formed with an inclined mounting portion 20 for mounting a total reflective member 21. The inclination of the reflective member 21 is such that the output laser beam E is deflected perpendicularly upon impingement on the reflective member 21, so that the output laser beam E is entirely directed toward the glass plate 17, as shown in FIG. 1.

According to the first embodiment of FIGS. 1-4, two leads 22 for the monitoring photodiode region 14 and the laser chip 15 are made to extend through the frame 16, whereas the heat sink plate 11 works also as an additional lead. Thus, there are three leads in total. Further, a light guide 23 made of transparent or semi-transparent material is formed on the mount 13 to extend between the rear facet 15" and the monitoring photodiode region 14 (see FIG. 3), so that the monitor laser beam E' is reliably received by the monitoring photodiode region 14.

With the arrangement described above, since the reflective member 21 deflects the output laser beam E toward the glass plate 17, the laser chip 15 can be mounted in a lying posture. Thus, the heat sink plate 11 need not be provided with an upright mounting block for the laser chip 15, so that the size (particularly height) of the laser device can be greatly reduced.

EMBODIMENT 2

Figure 5:
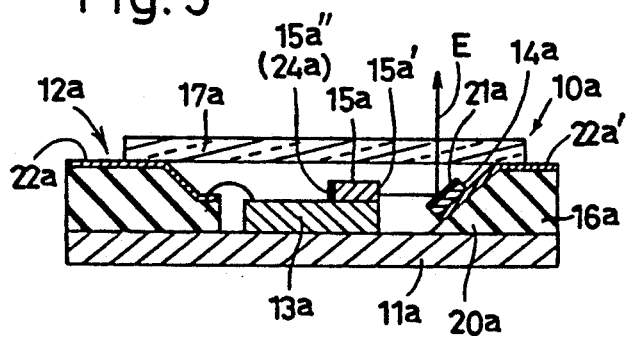
FIG. 5 is a sectional side view showing a semiconductor laser device according to a second embodiment of the present invention.
Figure 6:
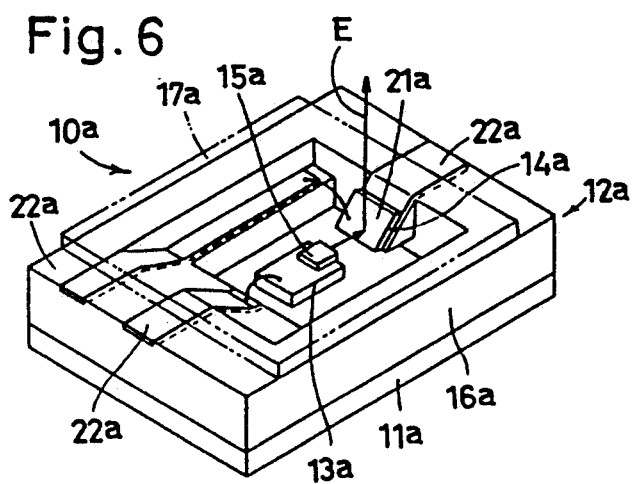
FIG. 6 is a perspective view showing the laser device of FIG. 5.

FIGS. 5 and 6 show a semiconductor laser device 10a according to a second embodiment of the present invention. Similarly to the first embodiment, the laser device 10a of the second embodiment comprises a thin heat sink plate 11a and a cap 12a. The heat sink plate 11a supports a flat mount 13a which, in turn, carries a semiconductor laser chip 15a. The cap 12a includes a frame 16a and a glass plate 17a. The frame 16a may be made of a resin such as liquid crystal polymer.

On the other hand, the rear facet 15a" of the laser chip 15a is covered by a total reflective film 24a, so that all light energy is emitted only from the front facet 15a' of the laser chip as an output laser beam E. Further, a monitoring photodiode chip 14a is mounted on an inclined mounting portion 20a of the frame 16a, and the photodiode chip 14a is covered by a semi-reflective film 21a. The semi-reflective film 21a is capable of deflecting a major portion (about 80% for example) of the output laser beam E toward the glass plate 17a while allowing the remaining portion of the output laser beam to reach the photodiode chip 14a.

Further, in the second embodiment, three leads 22a for the photodiode chip 14a and the laser chip 15a are formed on the frame 16a under the glass plate 17a. One of these leads is made to extend between the photodiode chip 14a and the inclined mounting portion 20a.

With the arrangement described above, the photodiode chip 14a directly monitors the output laser beam E itself. Thus, the photodiode chip 14a is capable of accurately monitoring the laser output with a high monitoring output.

EMBODIMENT 3

Figure 7:
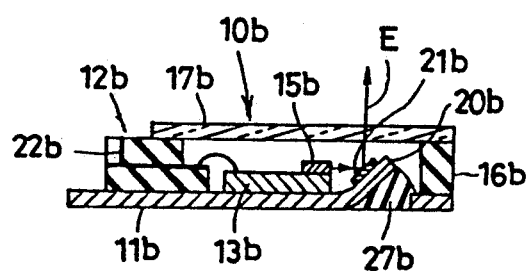
FIG. 7 is a sectional side view showing a semiconductor laser device according to a third embodiment of the present invention.
Figure 8:
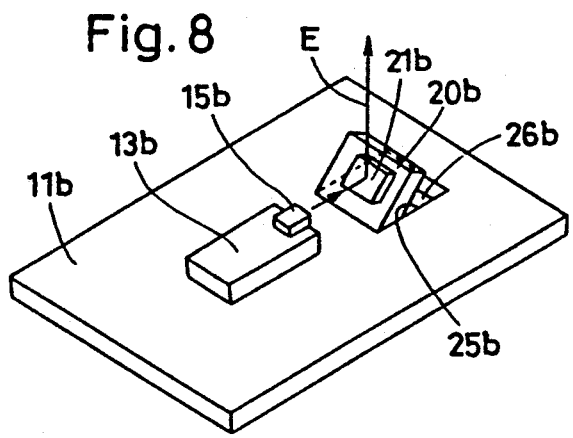
FIG. 8 is a perspective view showing a principal portion of the laser device of FIG. 7.

FIGS. 7 and 8 show a semiconductor laser device 10b according to a third embodiment of the present invention. Similarly to the first embodiment, the laser device 10b of the third embodiment comprises a thin heat sink plate 11b and a cap 12b. The heat sink plate 11a supports a flat mount 13b which, in turn, carries a semiconductor laser chip 15b. The cap 12b includes a frame 16b and a glass plate 17b.

On the other hand, the third embodiment basically differs from the first embodiment in that the heat sink plate 11b is integrally formed with an inclined mounting portion 20b for mounting a total reflective member 21b. For this purpose, an angular U-shaped cut 25b is formed in the heat sink plate 11b to partially surround a portion thereof (see FIG. 8), and the partially surrounded portion of the heat sink plate is obliquely raised to leave a corresponding perforation 26b. The perforation 26b thus formed is then closed by a resinous closure 27b, thereby isolating the interior of the laser device package from the exterior.

It should be appreciated that the laser device 10b of the third embodiment is otherwise similar to that of the first embodiment. However, a monitoring photodiode region (14 in FIG. 3) and a light guide (23 in FIG. 3) are not shown in FIGS. 7 and 8 to avoid complexity of illustration.

According to the third embodiment, the inclination of the mounting portion 20b can be adjusted even after mounting of the reflective member 21b. Thus, it is possible to accurately position the reflective member 21b relative to the laser chip 15b, thereby improving the quality of the product. Further, since the laser chip 15b and the reflective member 21b can be mounted prior to attachment of the frame 16b relative to the heat sink plate 11b, assembly of the laser device 10b can be greatly facilitated.

EMBODIMENT 4

Figure 9:
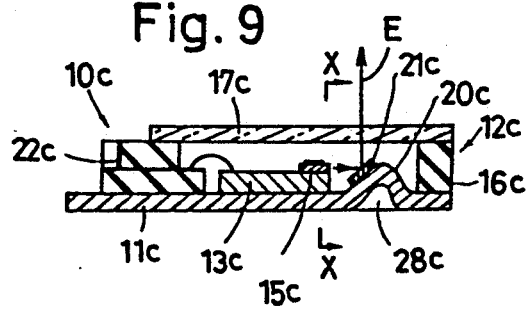
FIG. 9 is a sectional side view showing a semiconductor laser device according to a fourth embodiment of the present invention.
Figure 10:
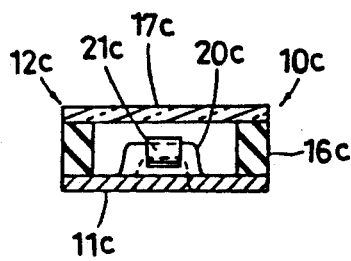
FIG. 10 is a sectional view taken along lines X-X in FIG. 9.

FIGS. 9 and 10 show a semiconductor laser device 10c according to a fourth embodiment of the present invention. The semiconductor laser device 10c of the fourth embodiment is similar to that of the third embodiment but differs therefrom only in that an inclined mounting portion 20c is formed by pressing the underside of a heat sink plate 11c toward a glass plate 17c. As a result, a recess 28c is formed on the underside of the heat sink plate 11c, but no perforation is formed. Thus, there is no need to subsequently close the recess 28c.

EMBODIMENT 5

Figure 11:
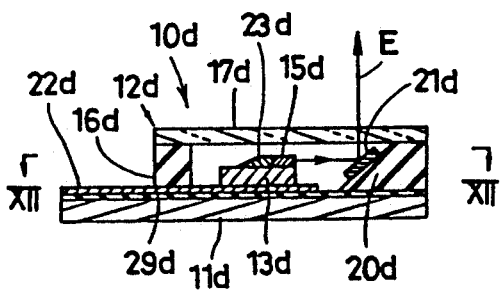
FIG. 11 is s sectional side view showing a semiconductor laser device according to a fifth embodiment of the present invention.
Figure 12:
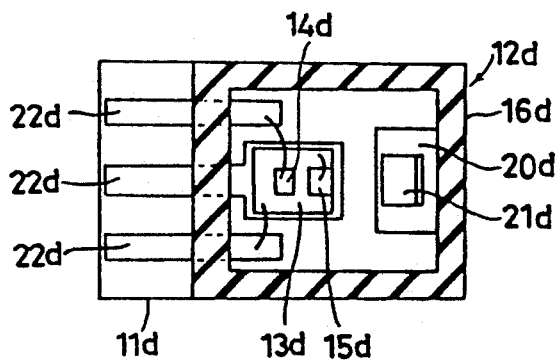
FIG. 12 is a sectional view taken along lines XII—XII in FIG. 11.
Figure 13:
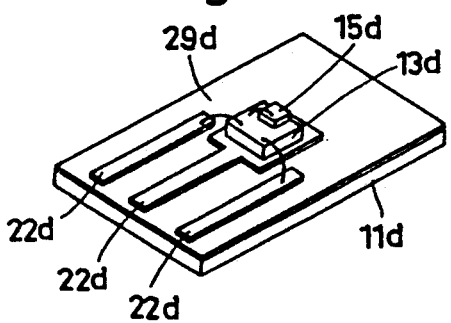
FIG. 13 is a perspective view showing a principal portion of the laser device of FIG. 11.

FIGS. 11-13 show a semiconductor laser device 10d according to a fifth embodiment of the present invention. The laser device 10d of the fifth embodiment is similar to that of the first embodiment (FIGS. 1-4) but differs therefrom only in the following points.

Specifically, a thin metallic heat sink plate 11d has an upper surface entirely covered by an insulating layer 29d, and three leads 22d are formed on the insulating layer 29d by patterning a conductor layer. A flat mount 13d is attached on the central one of the leads 22d for carrying a semiconductor laser chip 15d.

Obviously, the fifth embodiment is advantageous in the simplicity of forming the leads 22d. Thus, the manufacturing cost can be additionally reduced in comparison with the foregoing embodiments.

The fifth embodiment may be modified to have an arrangement in which the insulating layer 29d is partially removed to attach the mount 13d directly on the metal heat sink plate 11d while forming only two leads on the insulating layer 29d. In such a modification, the heat sink plate 11d itself works as another lead.

EMBODIMENT 6

Figure 14:
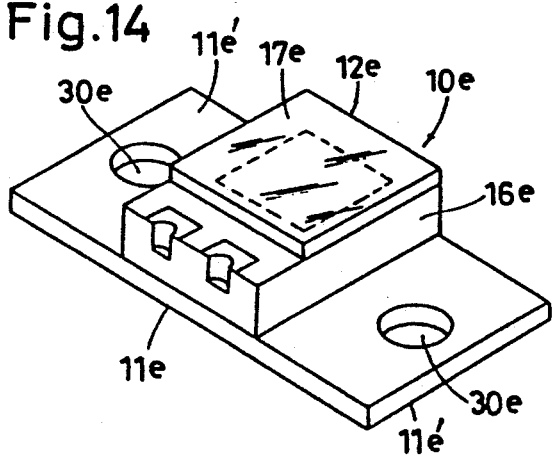
FIG. 14 is a perspective view showing a semiconductor laser device according to sixth embodiment of the present invention.

FIG. 14 shows a semiconductor laser device 10e according to a sixth embodiment of the present invention. The laser device 10e of this embodiment differs from that of the first embodiment (FIGS. 1-4) only in that use is made of a heat sink plate 11e which has a pair of lateral extensions 11e'. Each of the lateral extensions 11e' is formed with a mounting bore 30e used conveniently for mounting the laser device 10e to a support part of an apparatus (not shown) in which the laser device is incorporated.

It should be appreciated that the heat sink plate 11e' of the sixth embodiment may be also used for any of the second to fifth embodiments (FIGS. 5-13).

EMBODIMENT 7

Figure 15:
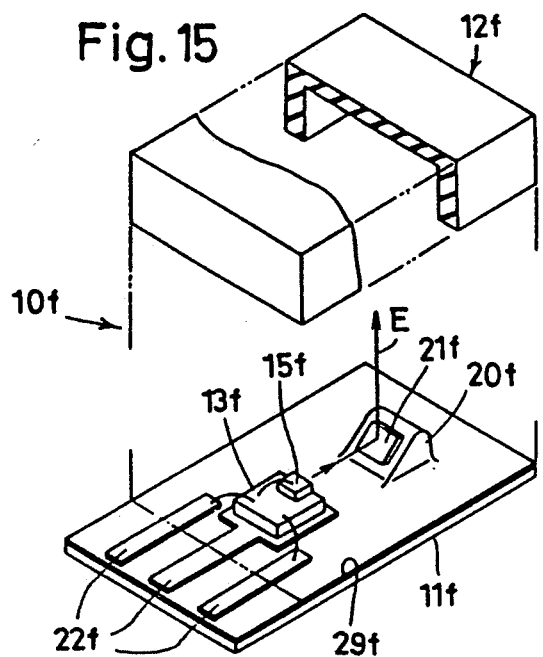
FIG. 15 is an exploded perspective view showing a semiconductor laser device according to a seventh embodiment of the present invention.

FIG. 15 shows a semiconductor laser device 10f according to a seventh embodiment of the present invention.

The laser device 10f of the seventh embodiment comprises a thin metallic heat sink plate 11f and a cap 12f. The cap 12f is integrally formed of a transparent resin, so that it has no separate glass plate.

Similarly to the fifth embodiment (FIGS. 11-13), the heat sink plate 11f is formed with an insulating layer 29f, and three leads 22f are formed on the insulating layer 29f. The central one of the leads 22f is used for attaching a mount 13f which carries a semiconductor laser chip 15f.

On the other hand, the heat sink plate 11f is provided with an inclined mounting portion 20f which is formed by pressing the underside of the heat sink plate 11f in the same manner as in the fourth embodiment (FIGS. 9 and 10). A reflective member 21f is mounted on the inclined mounting portion 20f.

According to the seventh embodiment, since the cap 12f is integrally made of a transparent resin, there is no need to use a separate glass plate, thereby simplifying the overall structure. Thus, the laser device 10f can be manufactured at an additionally lower cost.

EMBODIMENT 8

Figure 16:
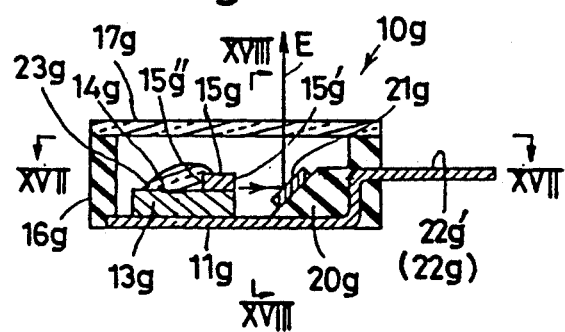
FIG. 16 is a sectional side view showing a semiconductor laser device according to an eighth embodiment of the present invention.
Figure 17:
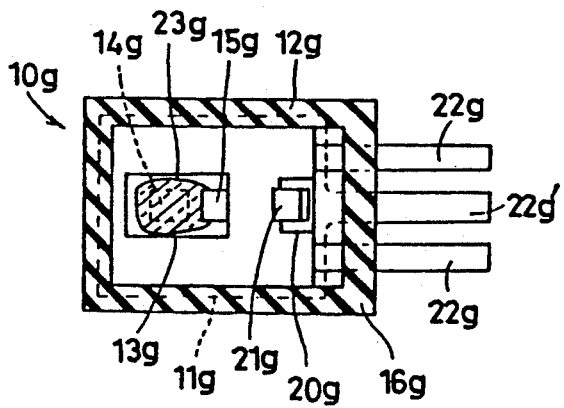
FIG. 17 is a sectional view taken along lines XVII—XVII in FIG. 16.
Figure 18:
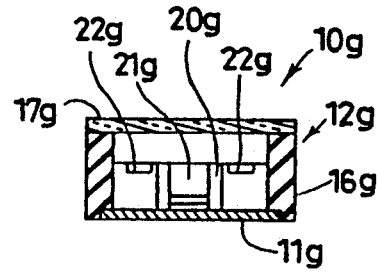
FIG. 18 is a sectional view taken along lines XVIII—XVIII in FIG. 16.

FIGS. 16–18 show a package-type semiconductor laser device 10g according to an eighth embodiment of the present invention. The laser device 10g of this embodiment comprises a thin metallic heat sink plate 11g and a cap 12g mounted on the heat sink plate 11g.

The heat sink plate 11g supports a flat mount 13g which itself has a monitoring photodiode region 14g, and a semiconductor laser chip 15g is attached on the mount 13g. The orientation of the laser chip 15g is such that it emits an output laser beam E from its front facet 15g' in parallel to the heat sink plate 11g while also emitting a monitor laser beam E' from its rear facet 15g'.

The cap 12g includes a frame 16g and a glass plate 17g. The frame 16g is made of a heat-resistant insulating resin and molded together with the heat sink plate 11g, as described hereinafter. The frame 16g has a window opening closed by the glass plate 17g attached thereto.

The frame 16g is internally formed with an inclined mounting portion 20g for mounting a total reflective member 21g. The inclination of the reflective member 21g is such that the output laser beam E is deflected perpendicularly upon impingement on the reflective member 21g, so that the output laser beam E is directed toward the glass plate 17g. Further, a light guide 23g made of transparent or semi-transparent is formed on the mount 13g to extend between the rear facet 15g'' and the monitoring photodiode region 14g, so that the monitor laser beam E' is reliably received by the monitoring photodiode region 14.

According to the eighth embodiment of FIGS. 16–18, two leads 22g are made to extend through the frame 16g without electrically contacting the heat sink plate 11g, whereas another lead 22g' is formed integral with the heat sink plate 11g. These leads 22g, 22g' together with the heat sink plate 11g are hermetically fixed to the frame 16g at the time of molding the latter, as described below.

The laser device 10g having the above structure is manufactured in the following way.

Figure 19:
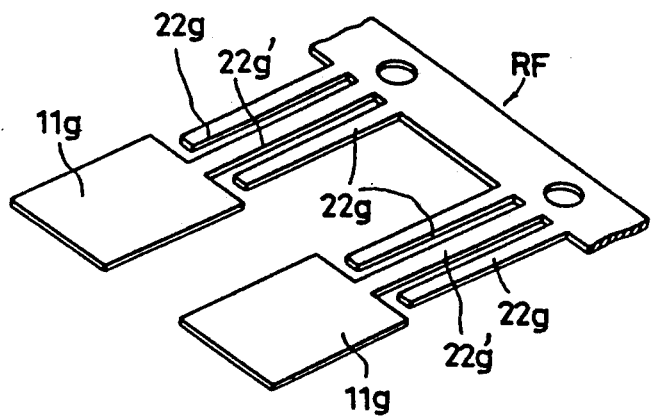
FIGS. 19 to 21 are perspective views showing the successive steps of making the laser device of the eighth embodiment.

First, as shown in FIG. 19, a leadframe RF is prepared which has groups of three leads 22g, 22g' arranged at predetermined pitch. The central one 22g' of the leads in each group is integral with a heat sink plate 11g.

Figure 20:
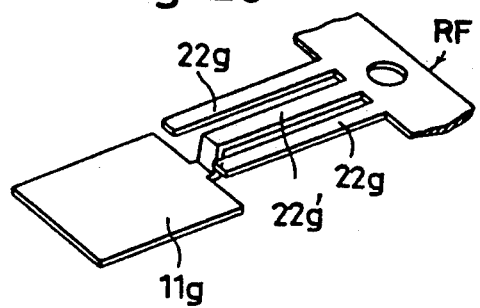

Then, the leadframe RF is transferred longitudinally thereof. During such transfer, each central lead 22g' is bent near the corresponding heat sink plate 11g so that the heat sink plate 11g is positioned slightly lower than the plane of the leadframe RF, as shown in FIG. 20.

Figure 21:
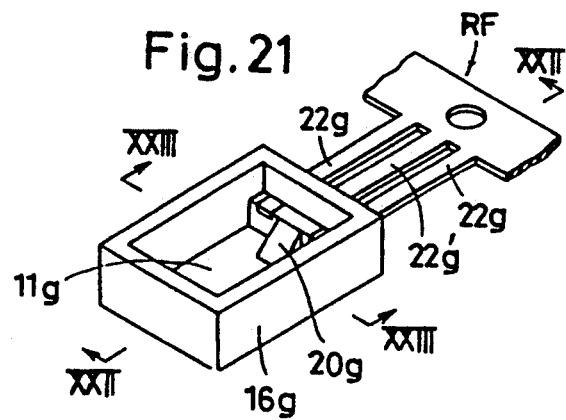
Figure 27:
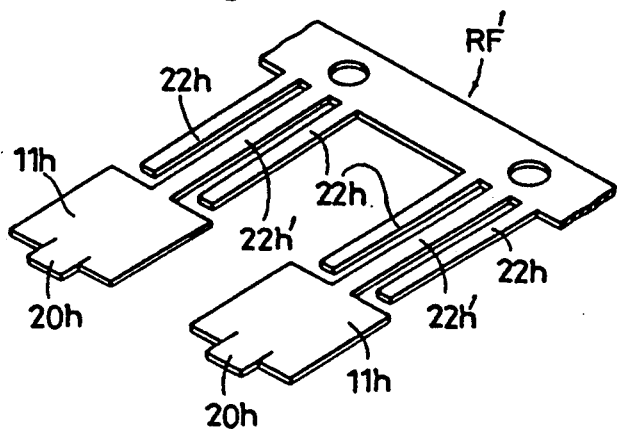
FIGS. 27 and 28 are perspective views showing the successive steps of making the laser device of the ninth embodiment.
Figure 28:
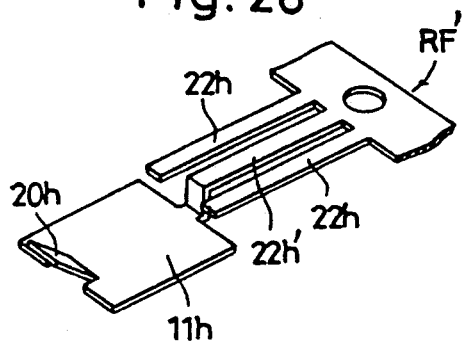
Figure 29:
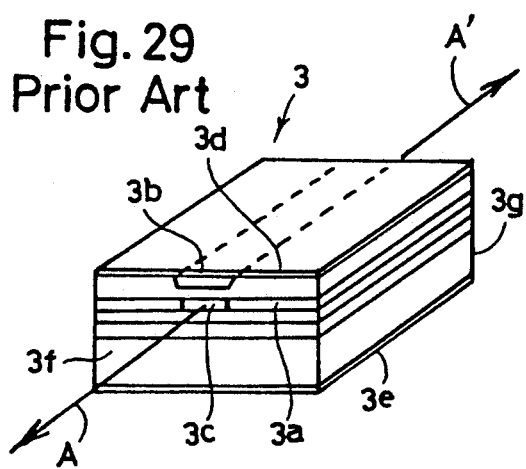
FIG. 29 is a perspective view showing a prior art semiconductor laser chip.
Figure 30:
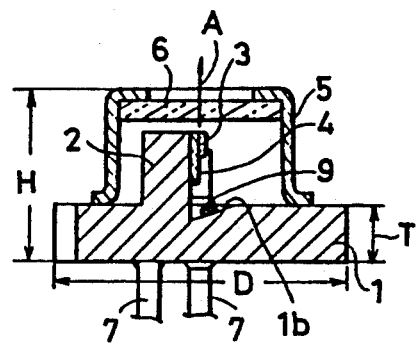
FIG. 30 is a sectional side view showing a prior art semiconductor laser device incorporating the laser chip illustrated in FIG. 29.
Figure 31:
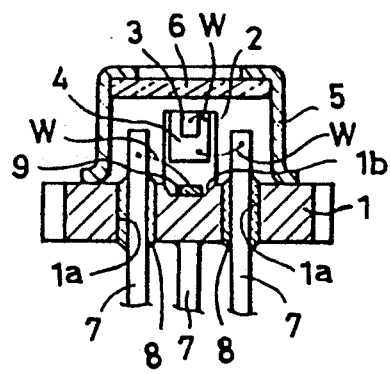
FIG. 31 is a sectional front view showing the prior art laser device.
Figure 32:
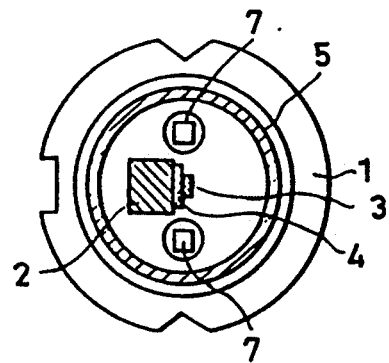
FIG. 32 is a plan view showing the same prior art laser device.

Then, each group of leads 22g, 22g' is placed in a mold (namely, interposed between a pair of mold members), and fluid resin is injected into the mold under pressure. As a result, a frame 16g is obtained which is connected to the leadframe RF, as shown in FIGS. 21–23.

Then, suitable die (chip) bonding and wire bonding are performed, and a glass plate 17g (see FIGS. 16–18) is fixedly attached to the molded frame 16g. Finally, the frame 16g is cut off the leadframe RF to obtain a final product.

EMBODIMENT 9

FIGS. 24–26 show a semiconductor laser device 10h according to a ninth embodiment of the present invention. Similarly to the eighth embodiment (FIGS. 16–18), the laser device 10h of the ninth embodiment comprises a thin heat sink plate 11h and a cap 12h. The heat sink plate 11h supports a flat mount 13h which, in turn, carries a semiconductor laser chip 15h. The cap 12h includes a resinous frame 16h and a glass plate 17h.

On the other hand, the rear facet 15h'' of the laser chip 15h is entirely covered by a total reflective film 24h, so that all light energy is emitted only from the front facet 15h' of the laser chip as an output laser beam E. Further, a monitoring photodiode chip 14h is mounted on an inclined mounting portion 20h which is formed integrally with the heat sink plate 11h, and the photodiode chip 14h is covered by a semi-reflective film 21h. The semi-reflective film 21h is capable of deflecting a major portion (about 80% for example) of the output laser beam E toward the glass plate 17h while allowing the remaining portion of the output laser beam to reach the photodiode chip 14h.

Further, two leads 22h are made to extend through the frame 16h without electrically contacting the heat sink plate 11h, whereas another lead 22h' is formed integral with the heat sink plate 11h. These leads 22h, 22h' together with the heat sink plate 11h are hermetically fixed to the frame 16h at the time of molding the latter, as described below.

The laser device 10h having the above structure is manufactured in the following way.

First, as shown in FIG. 19, a leadframe RF' is prepared which has groups of three leads 22h, 22h' arranged at predetermined pitch. The central one of the leads in each group is integral with a heat sink plate 11h which, in turn, is integral with a bendable lip 20h (which later provides an inclined mounting portion).

Then, the leadframe RF' is transferred longitudinally thereof. During such transfer, each central lead 22h' is bent near the corresponding heat sink plate 11h so that the heat sink plate 11h is positioned slightly lower than the plane of the leadframe RF', as shown in FIG. 20. Further, the bendable lip 20h is inclined upward.

Then, the leadframe RF' is subjected to subsequent process steps substantially in the same manner as described in connection with the eighth embodiment.

The present invention being thus described, it is obvious that the same may be varied in many ways. Such variations are not to be regarded as a departure from the spirit and scope of the invention, and all such modifications as would be obvious to those skilled in the art are intended to be included within the scope of the following claims.

We claim:

1. A package-type semiconductor laser device comprising:
   a metallic heat sink plate having a substantially flat support surface and an exposed surface directed away from the support surface;
   a semiconductor laser chip carried by the support surface of the heat sink plate, the laser chip having a front light emitting facet oriented so that the laser chip emits an output laser beam generally in parallel to the support surface of the heat sink plate;

a cap mounted on the support surface of the heat sink plate to enclose the laser chip, the cap having a transparent window in opposed relation to the support surface of the heat sink plate; and a reflective member arranged within the cap for deflecting the output laser beam toward the window of the cap.

2. The laser device according to claim 1, wherein the cap comprises an insulating frame surrounding the laser chip and having a window opening away from the heat sink plate, and a separate transparent plate attached to the frame to close the window opening.

3. The laser device according to claim 2, further comprising leads penetrating through the frame, each of the leads having at least a portion extending substantially in parallel to the support surface of the heat sink plate.

4. The laser device according to claim 3, wherein the frame is made of ceramic.

5. The laser device according to claim 3, wherein the frame is made of resin and molded together with the leads.

6. The laser device according to claim 2, further comprising leads provided on the frame under the transparent plate, each of the leads having at least a portion extending substantially in parallel to the support surface of the heat sink plate.

7. The laser device according to claim 2, wherein the support surface of the heat sink plate is formed with an insulating layer, the laser device further comprising leads formed on the insulating layer, each of the leads having at least a portion extending substantially in parallel to the support surface of the heat sink plate.

8. The laser device according to claim 2, wherein the frame is provided with an inclined mounting portion for mounting the reflective member.

9. The laser device according to claim 2, wherein the heat sink plate is provided with an inclined mounting portion for mounting the reflective member.

10. The laser device according to claim 1, wherein the support surface of the heat sink plate is formed with an insulating layer carrying leads, the heat sink plate being provided with an inclined mounting portion for mounting the reflective member, the cap being entirely made of transparent resin.

11. The laser device according to claim 1, wherein the heat sink plate has a pair of lateral extensions each formed with a mounting bore.

12. The laser device according to claim 1, wherein the laser chip is attached on a mount which is attached on the support surface of the heat sink plate, the laser chip having a rear facet for emitting a monitor laser beam, the mount being provided with a monitoring photodiode and a light guide for guiding the monitor laser beam to the monitoring photodiode.

13. The laser device according to claim 1, wherein the laser chip has a rear facet covered by a reflective film, the deflecting reflective member is attached on a photodiode, the deflecting reflective member allows part of the output laser beam to reach the photodiode.

14. A package-type semiconductor laser device comprising:

a metallic heat sink plate having a substantially flat support surface and an exposed surface directed away from the support surface;

a semiconductor laser chip carried by the support surface of the heat sink plate, the laser chip having a front light emitting facet oriented substantially perpendicularly to the support surface of the heat sink plate for emitting an output laser beam generally in parallel to the support surface of the heat sink plate;

a cap mounted on the support surface of the heat sink plate to enclose the laser chip, the cap having a transparent window in opposed relation to the support surface of the heat sink plate; and a reflective member arranged within the cap for deflecting the output laser beam toward the window of the cap.

15. A package-type semiconductor laser device comprising:

a metallic heat sink plate having a substantially flat support surface and an exposed surface directed away from the support surface;

a mount attached to the support surface of the heat sink plate, the mount having a flat mounting surface which is substantially parallel to the support surface of the heat sink plate;

a semiconductor laser chip attached on the mounting surface of the mount, the laser chip having a front light emitting facet oriented so that the laser chip emits an output laser beam generally in parallel to the support surface of the heat sink plate;

a cap mounted on the support surface of the heat sink plate to enclose the laser chip, the cap having a transparent window in opposed relation to the support surface of the heat sink plate; and a reflective member arranged within the cap for deflecting the output laser beam toward the window of the cap.

16. The laser device according to claim 15, wherein the front light emitting facet of the laser chip is oriented substantially perpendicularly to the support surface of the heat sink plate.

* * * * *